(12) United States Patent
Fischette et al.

(10) Patent No.: US 8,503,597 B2
(45) Date of Patent: Aug. 6, 2013

(54) METHOD TO DECREASE LOCKTIME IN A PHASE LOCKED LOOP

(75) Inventors: Dennis M. Fischette, Mountain View, CA (US); Rohit Kumar, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 350 days.

(21) Appl. No.: 12/982,854

(22) Filed: Dec. 30, 2010

(65) Prior Publication Data
US 2012/0170699 A1    Jul. 5, 2012

(51) Int. Cl.
*H03D 3/24*    (2006.01)

(52) U.S. Cl.
USPC .......................................... 375/376; 375/375

(58) Field of Classification Search
USPC ............ 375/354, 371, 373, 374, 375, 376, 375/377; 327/141, 154, 155, 156, 157, 158
See application file for complete search history.

(56) References Cited

U.S. PATENT DOCUMENTS

| | | | |
|---|---|---|---|
| 4,928,075 A * | 5/1990 | Leis | 331/17 |
| 5,384,502 A * | 1/1995 | Volk | 327/157 |
| 6,476,681 B1 * | 11/2002 | Kirkpatrick | 331/17 |
| 6,646,512 B2 | 11/2003 | Abassi | |
| 6,859,108 B2 | 2/2005 | Abbasi | |
| 7,327,197 B2 * | 2/2008 | Kriz | 331/17 |
| 7,352,249 B2 * | 4/2008 | Balboni et al. | 331/16 |
| 7,907,021 B2 | 3/2011 | Chen | |
| 7,940,140 B2 | 5/2011 | Zeng | |
| 2003/0025566 A1 | 2/2003 | Rogers | |
| 2003/0076177 A1 * | 4/2003 | Fischer | 331/17 |
| 2005/0264369 A1 * | 12/2005 | Sowlati et al. | 331/17 |
| 2006/0208778 A1 * | 9/2006 | Sowlati et al. | 327/157 |
| 2007/0090886 A1 * | 4/2007 | Kriz | 331/17 |
| 2007/0126512 A1 * | 6/2007 | Bellaouar et al. | 331/16 |
| 2007/0298747 A1 * | 12/2007 | Wu | 455/260 |
| 2010/0090768 A1 | 4/2010 | Yamazaki | |
| 2010/0183109 A1 * | 7/2010 | Lin et al. | 375/376 |

* cited by examiner

*Primary Examiner* — Tesfaldet Bocure
(74) *Attorney, Agent, or Firm* — Rory D. Rankin; Meyertons, Hood, Kivlin, Kowert & Goetzel, P.C.

(57) ABSTRACT

A method and mechanism for reducing lock time of a dual-path phase lock loop (PLL). The PLL comprises a dual-path low-pass filter (LPF). The LPF includes a first filter and a second filter. The first filter comprises a passive second-order lead-lag low-pass filter. The second filter comprises a first-order lag low-pass filter. During a lock-acquisition state, an impedance value within the second stage is bypassed, which increases the loop bandwidth of the PLL. In addition, a resistance within the first stage is increased in order to increase the gain of the first stage and maintain stability within the PLL. During a lock state, the impedance value may no longer be bypassed and the increased resistance may be returned to its original value.

20 Claims, 5 Drawing Sheets

METHOD TO DECREASE LOCKTIME IN A PHASE LOCKED LOOP

BACKGROUND OF THE INVENTION

1. Field of the Invention

This invention relates to electronic circuits, and more particularly, to efficiently reducing lock time of a dual-path phase locked loop (PLL).

2. Description of the Relevant Art

A phase-locked loop, or phase lock loop, (PLL) is an electronic control system for relating a phase and a frequency of a generated output signal to a phase and a frequency of a received input signal. In general, a frequency of an alternating signal is derived from a phase of the alternating signal. Therefore, maintaining the output phase of the output signal in lock step with the input phase of the input signal results in keeping the output frequency of the output signal in lock step with the input frequency of the input signal.

By being able to track the input frequency, the PLL may be used to provide an output signal with a same frequency as the reference signal. In such a case, the PLL may be used for demodulation in radio or telecommunications applications. The PLL may recover information from a noisy communication channel. Alternatively, the PLL may be used to provide an output signal with a frequency that is a multiple of the input frequency. In such a case, the PLL may be used for frequency synthesis, such as providing a high frequency clock signal for synchronizing digital logic designs. Microprocessors, application specific integrated circuits (ASICs), graphics processing units (GPUs), and so forth, may utilize a PLL for generating a higher frequency clock signal from a lower frequency reference signal.

A PLL includes several components. For example, a PLL comprises a variable frequency oscillator that generates a signal with a frequency that may be in lock step with the frequency of the input signal. For a PLL on a microprocessor, the received input signal is a periodic clock signal generated off chip from a reference clock source. Using a feedback loop, a phase detector within the PLL may compare the received input signal to a divided version of the generated output signal of the PLL. In a dual-path configuration, any measured phase difference is converted into two analog voltage signals by a charge-pump and a dual-path low-pass filter. A dual-path configuration for the PLL may be used to decouple the oscillator frequency and the oscillator gain, which is directly related to the tuning range or bandwidth of the PLL. The fast control path of the PLL provides a large gain allowing a wide tuning range. The slow control path provides a small gain. The slow control path bandwidth may be several orders of magnitude lower than the fast control path bandwidth. The two analog voltage values are typically passed through a dual-path low-pass filter prior to being received by the variable frequency oscillator. These values track the measured phase difference and accordingly cause the variable frequency oscillator to speed up or slow down to allow the generated output signal to track the frequency of the received input signal.

Generally speaking, the lock time of a PLL is the amount of time it takes the PLL to move from a first specified frequency to a second specified frequency within a given frequency tolerance. The PLL lock time affects startup and frequency re-lock during operation. Time constants associated with the slow control path portion of the dual-path low-pass filter may determine and slow down the PLL lock time. A slowed lock time decreases performance.

SUMMARY OF EMBODIMENTS OF THE INVENTION

Systems and methods for reducing lock time of a dual-path PLL are contemplated.

In one embodiment, dual-path phase lock loop (PLL) circuit is contemplated which includes an oscillator, phase detector and low-pass filter. The oscillator is configured to adjust a frequency of an output signal based at least in part on a voltage difference between a first signal and a second signal. The phase detector is configured to generate a first control signal and a second control signal based at least in part on a phase difference between a reference signal and the output signal. The low-pass filter (LPF) is coupled to the phase detector and includes both a first stage and a second stage. The first stage is configured to convey the first signal and convey an intermediate signal, and the second stage is coupled to receive the intermediate signal. In response to detecting the PLL is in a locked state, the second stage is configured to convey the second signal based at least in part on the intermediate signal and an intervening impedance element. In response to detecting the PLL is not in a locked state, the second stage is configured to convey the second signal based at least in part on the intermediate signal while bypassing the intervening impedance element.

Also contemplated are embodiments of a dual-path phase lock loop (PLL) which comprises a dual-path low-pass filter (LPF). The LPF includes a first stage, or a first filter, and a second stage, or a second filter. The first stage comprises a passive second-order lead-lag low-pass filter. The second stage comprises a first-order lag low-pass filter. During a lock-acquisition state, the PLL attempts to align the phase and frequency of a generated output signal with the phase and frequency of a received reference signal. During this lock-acquisition state, an impedance value within the second stage is bypassed, which increases the loop bandwidth of the PLL. In addition, a resistance within the first stage is increased in order to increase the gain of the first stage and maintain stability within the PLL. When the PLL achieves alignment between the output signal and the received reference signal, a state machine may detect a lock state for the PLL. During the lock state, the impedance value may not be bypassed any longer and the increased resistance may be returned to its original value.

These and other embodiments will be further appreciated upon reference to the following description and drawings.

Figure 1:
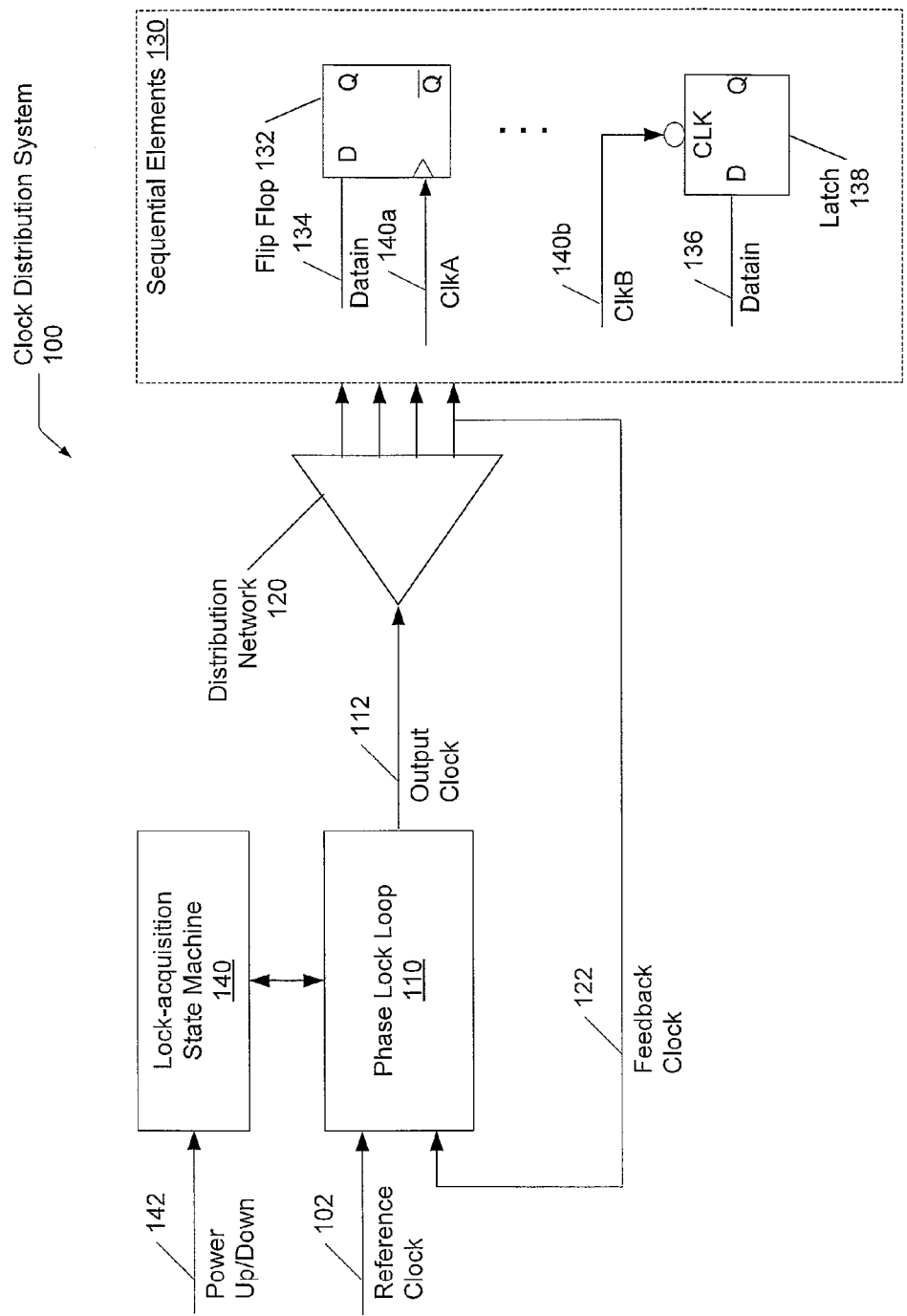
FIG. 1 is a generalized block diagram of one embodiment of a clock distribution system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Referring to FIG. 1, one embodiment of a generalized block diagram of a clock distribution system 100 is shown. The system 100 comprises a phase lock loop (PLL) 110. The PLL 110 may receive a reference clock signal 102. In one embodiment, the reference clock signal 102 may be generated by a clock source off-chip, such as a crystal oscillator. The PLL 110 may generate an output clock signal 112 that is received by a clock distribution network 120. The clock distribution network 120 may convey multiple clock signals across a semiconductor die to sequential elements 130 and a feedback clock signal 122 to the PLL 110. In the embodiment shown, the feedback clock signal 122 is provided from the distributed clock signals conveyed to the sequential elements 130. In an alternative embodiment, the feedback clock signal 122 is conveyed from the output clock signal 112.

In the embodiment shown, the PLL 110 may be used to align the setup and hold time windows for sequential elements 130. Sequential elements 130 may comprise flip-flop circuits 132 and latches 138. This embodiment does not include all examples of timing paths and sequential elements such as replacing combinatorial logic with dynamic logic, or utilizing a memory such as a random access memory (RAM) cell or a register file circuit. The embodiment shown is for a simple illustrative purpose.

Flip-flop 132 may use a master-slave latch configuration. Flip-flop circuit 132 may also include single or double output lines, and one of many embodiments for feedback circuits and scan circuitry. A data input signal is received by line Datain 134. In this embodiment, flip-flop circuit 132 receives a distributed clock signal, ClkA, on line 140a. Similarly, latch 138 receives a data input signal on line Datain 136 and a distributed clock signal, ClkB, on line 140b.

The sequential elements 130 receive distributed clock signals from distribution network 120. Typically, a generated high-frequency clock signal (output clock 112 from the PLL 110) is distributed across a semiconductor die in a manner that the distributed clock signals arrive at the sequential elements 130 at approximately a same time. There may be a very large number of sequential elements within elements 130. In general, the output clock 112 is distributed using matched paths consisting of a number of drivers in a tree configuration. As is well known in the art, some examples of common clock distribution schemes include a binary tree, a H-tree, an X-tree, and so forth.

The PLL 110 may be used to multiply the frequency of the reference clock signal 102 and then align the rising and falling edges of the distributed output clock to the edges of the received reference clock signal 102. The components within the PLL 110 used to accomplish this alignment are described shortly. In addition, the PLL 110 may be included in power savings techniques. A microprocessor or other semiconductor chip comprising the PLL 110 may have a standby mode, which may also be referred to as a sleep mode or power down mode. The PLL 110 may not provide a clock output signal 112 during these modes.

At a later time, the semiconductor chip may be "awakened" or enter a power up mode. At this time, the PLL 110 again attempts to synchronize the frequency and the phase of the output clock signal 112 with the frequency and the phase of the received reference clock signal 102. A process in which the PLL 110 reduces the phase difference between the reference clock 102 and the output clock 112 may be referred to as a lock-in, or a lock-acquisition, process. The PLL 110 is performing a lock acquisition by attempting to resynchronize the phase of the output clock 112 with the phase of the reference clock 102. When the measured phase difference between the two clocks 102 and 112 is below a given threshold, then the synchronization has occurred. At this time the PLL 110 may be referred to as locked or in a lock state. The lock-in, or lock-acquisition, state has ended.

A state machine, such as the lock-acquisition state machine 140, may receive a power up/down signal 142 indicating a standby or sleep mode is to begin. The state machine 140 may convey an indication to the PLL 110 to stop providing an output clock 112 with a frequency synchronized with the reference clock 102. The semiconductor chip may achieve power savings by this process. Similarly, the state machine 140 may receive a power up indication on line 142 and convey an indication to the PLL 110 to being a lock acquisition process. A lock time of the PLL 110 is the time duration from a start time when the PLL 110 begins the lock acquisition process to an end time when the PLL 110 generates the output clock 112 with a phase and/or a frequency within a given tolerance of the phase and/or the frequency of the reference clock 102. The lock time affects the performance of a corresponding semiconductor chip. The larger the lock time, the more the benefits of the power savings techniques are reduced.

Although the clock distribution system 100 is described with respect to a microprocessor or similar semiconductor chip, the principles also apply to radio frequency (RF) transceivers such as those used in cellular phones and other wireless mobile devices such as Bluetooth® devices. For example, these transceivers may use frequency-hopping spread spectrum (FHSS) for transmitting radio signals. These transceivers may rapidly switch a carrier among many frequency channels, using a pseudorandom sequence known to both a transmitter and a receiver. This method may be used in a frequency-hopping code division multiple access (FH-CDMA) scheme. For a wireless phone operating in a CDMA communication system, the phone may power down particular circuits under a variety of conditions.

Generally, the lock-acquisition state machine 140 may receive many inputs not shown to determine a frequency change for the PLL 110. In one example, the phone may be operating in a reduced data rate mode as the phone's transmitter conveys data packets. To conserve power and extend battery life, portions of the phone's transmitter may be powered down during the time period in which the phone is not expected to transmit any data. In addition, many wireless systems use frequency hopping in data security protection schemes and to avoid interference. The larger the lock time of the PLL 110, the less time is available for transmitting or receiving data, which reduces an effective data rate. Before describing methods for reducing the lock time of the PLL 110, a description of the components within the PLL 110 is provided.

Figure 2:
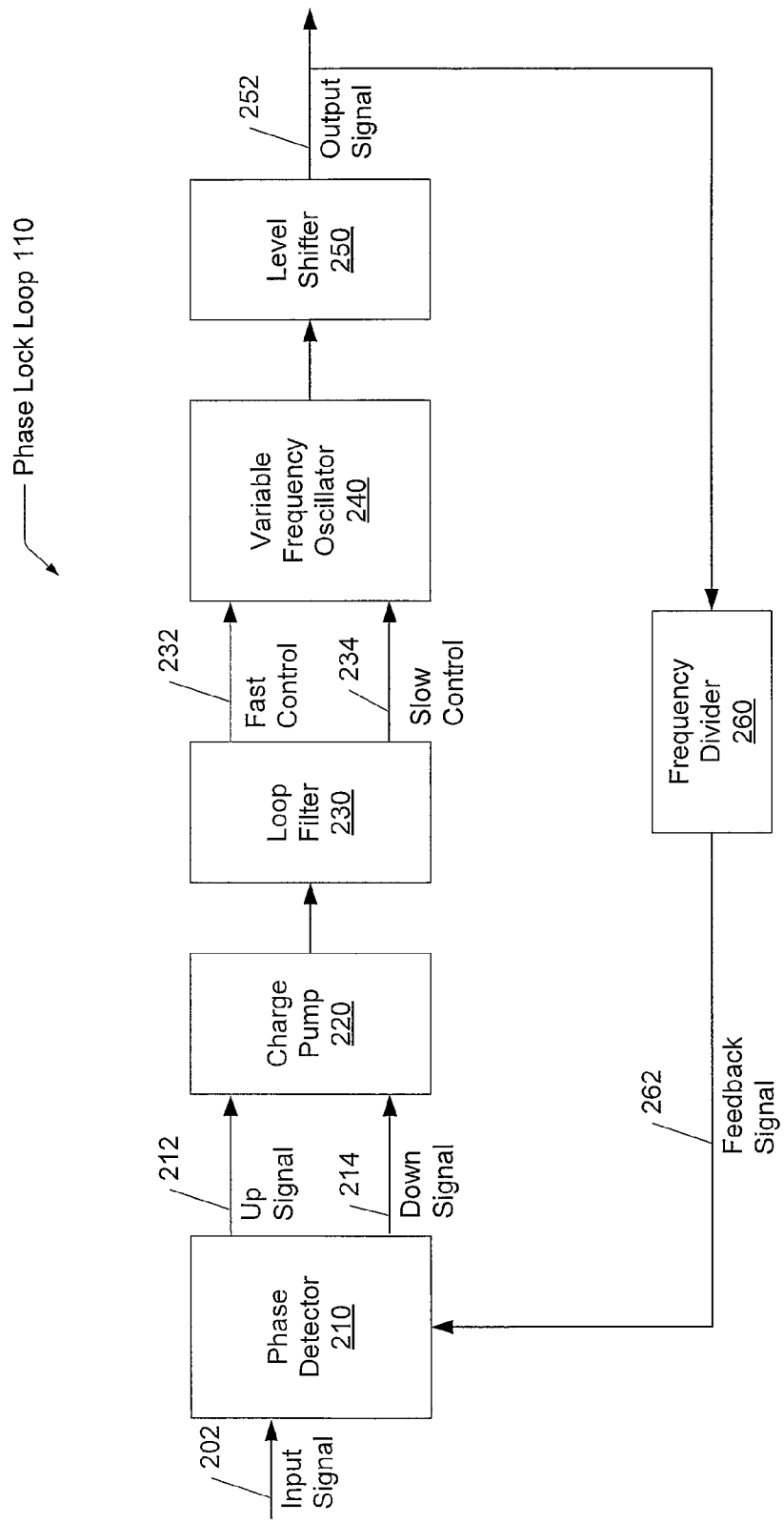
FIG. 2 is a generalized block diagram illustrating one embodiment of a phase lock loop (PLL).

Turning now to FIG. 2, one embodiment of a generalized block diagram of a phase lock loop 110 is shown. The PLL 110 may utilize a negative feedback closed-loop configuration. An input signal 202 may be a periodic clock signal generated off chip to be used as a reference clock signal with a reference phase and a reference frequency. A phase detector 210 may receive the input signal 202. The phase detector 210 may also receive a feedback signal 262 to compare to the input signal 202.

In one embodiment, the feedback signal 262 is a divided version of a local generated signal, such as the output signal 252. In another embodiment, the feedback signal 262 is a divided version of a distributed signal derived from the output signal 252. In one embodiment, a frequency divider 260 generates the feedback signal 262. In other embodiments, no frequency divider is used or an additional frequency divider is also used for the input signal 202. One or more frequency dividers may be used to provide the output frequency of the output signal 252 as a rational multiple of the input frequency of the input signal 202.

The phase detector compares the input signal 202 and the feedback signal 262 and generates one or more control signals, such as the up signal 212 and the down signal 214, wherein the magnitude of these signals may be proportional to a measured phase difference. The control signals 212 and 214 are conveyed to a charge pump 220, which provides a current output to control the charge stored in the loop filter 230. Therefore, the control signals 212 and 214 are converted to analog voltage signals. The loop filter 230 filters out higher frequencies, glitches, spurious noise, and reference spurs from the current output signal conveyed from the charge pump 220. The direct current (dc) component of generated voltage control signals 232 and 234 are provided to the oscillator 240. The filtering out of higher frequencies and noise may reduce jitter in the output signal 252. The loop filter may convey two voltage control signals, fast control 232 and slow control 234, to the variable frequency oscillator 240. In one embodiment, the loop filter 230 is a dual-path low-pass filter.

The oscillator 240 may be configured to generate the output signal 252 with a variable frequency. An optional level shifter 250 may be used to provide a full supply voltage swing of the output clock signal 252. The oscillator 240 may be a voltage-controlled oscillator (VCO). The voltage control signals, 232 and 234, conveyed from the loop filter 230 to the oscillator 240 may increase or decrease in response to a measured phase difference by the phase detector 210. The changes in the voltage control signals 232 and 234 may cause the oscillator 240 to speed up or slow down in an attempt to match the input frequency of the input signal 202. When the difference in phases and/or frequencies between the output signal 252, or alternatively the feedback signal 262, and the input signal 202 is within a given tolerance, then the output signal 252 is locked on the input signal 202. The phase lock loop 110 may convey an indication of this lock to the state machine 140. The state machine may store a state indicating a lock state.

Similar for any filter, the closed-loop gain 3-dB frequency of the PLL 110 determines the loop bandwidth of PLL 110. This loop bandwidth is approximately the unity gain point for the PLL 110 open loop response and may be largely set by the loop filter 230. In addition, this loop bandwidth of the PLL 110 is a measure of the capability of the PLL 110 to track the input signal 202 and jitter. The loop bandwidth may also be referred to as a noise bandwidth. The wider (or higher) the loop bandwidth, the more the PLL 110 is able to track the input signal 202. Therefore, the lock time of the PLL 110 decreases and may be fast. However, the wider the loop bandwidth, the more jitter is permitted through the PLL 110 to the output signal 252. A narrow loop bandwidth causes the PLL 110 to have more trouble tracking the input signal 202. Therefore, the lock time of the PLL 110 increases and may be slow. However, a narrow loop bandwidth also causes the PLL 110 to generate a cleaner output signal clock signal 252.

Another parameter for the PLL 110 is a gain for the voltage-controlled oscillator (VCO) 240. This VCO gain measures a frequency change in the output signal 252 in response to a change in a voltage control signal received by the VCO 240. For example, a VCO gain of 0.5 MHz/mV indicates a one millivolt swing in a control voltage signal results in a half of one megahertz frequency change in the output signal 252. The VCO gain of the PLL 110 and a tuning range tend to be naturally coupled. A wide tuning range is associated with a large loop bandwidth and a large VCO gain. Therefore, a loop filter 230 that provides a wide tuning range may also provide a fast lock time for the PLL 110. However, a large VCO gain incorporates a coarse-level tuning. In addition, a large VCO gain is coupled to a large loop bandwidth, which may provide excessive jitter. To achieve fine-level tuning, a loop filter 230 with a small VCO gain may be used, but a small VCO gain is coupled to a small loop bandwidth, which may not well track the input signal 202 and the lock time of the PLL 110 increases.

In one embodiment, the loop filter 230 includes a dual-path configuration. A dual-path configuration allows for decoupling of the VCO gain from the tuning range (and loop bandwidth). A slow control path may provide a narrow tuning range and relaxed speed characteristics, such as a slow lock time for the PLL 110, but also a high VCO gain. A fast control path provides fast switching speeds and a large tuning range, but at a tradeoff of a low VCO gain. A dual-path configuration may provide flexibility in choosing loop parameters to optimize jitter, such as allowing the PLL 110 to support a wide tuning range with low jitter.

To support the dual-path configuration, the loop filter 230 may be a dual-path low-pass filter. The dual-path low-pass filter design supports loop bandwidth adjustment by controlling gain in the slow control path and supports reduction of a damping factor by controlling gain in the fast control path. During the lock-in process, the time constants associated with the slow control path within the loop filter 230 may determine the duration of the lock time of the PLL 110. Generally speaking, the wider the loop bandwidth, the more the lock time is reduced. However, the trade-off is that a wider loop bandwidth may result in instability as the integrated phase noise increases and reference spurs are not attenuated. Instability may lead the PLL 110 to permanently lose a lock.

Figure 3:
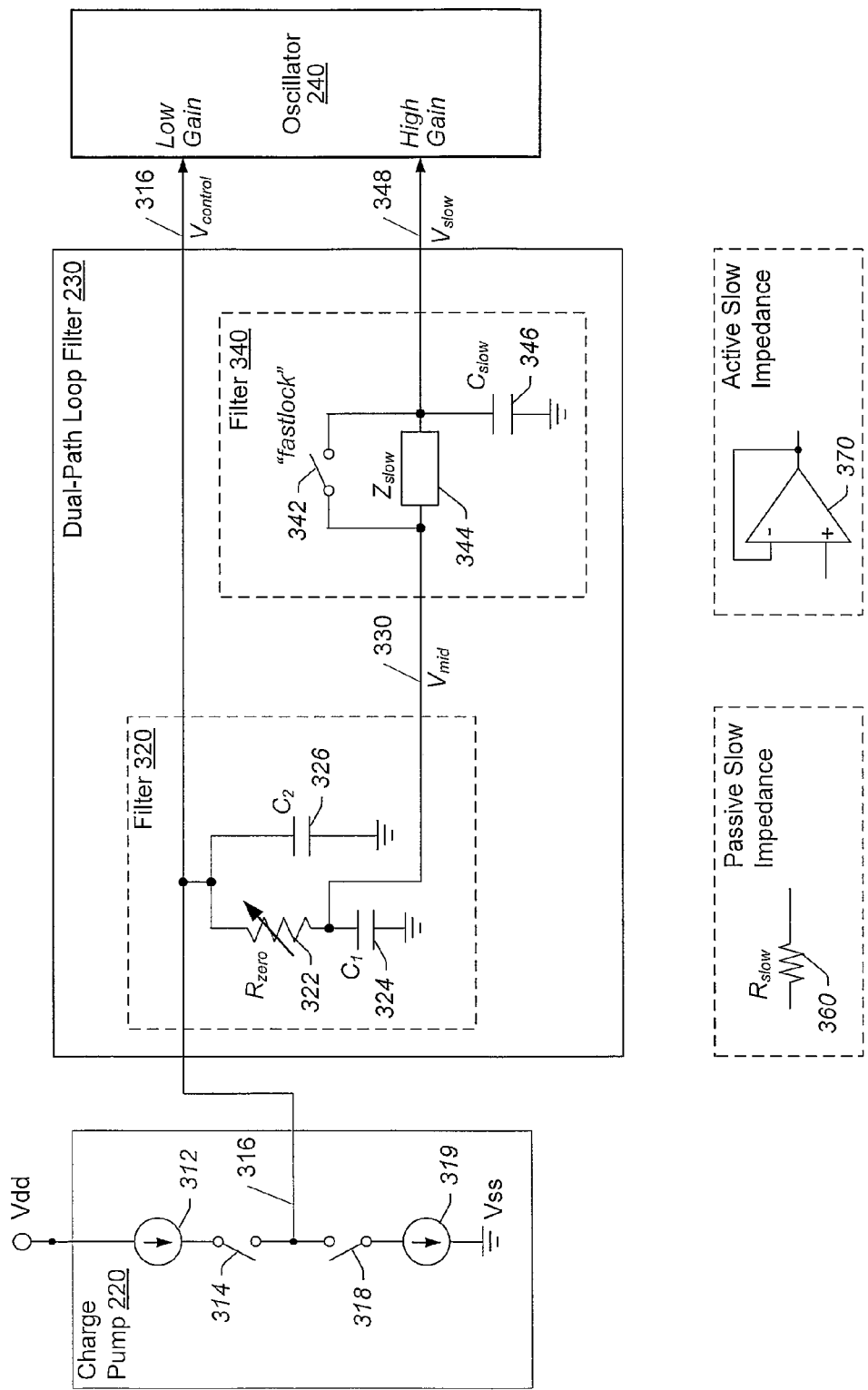
FIG. 3 is a generalized block diagram illustrating another embodiment of a dual-path low-pass filter with adjoining components within a PLL.

Referring now to FIG. 3, one embodiment of a generalized block diagram of a dual-path low-pass filter with adjoining components is shown. As shown, a charge pump 220 includes current sources 312 and 319 and switches 314 and 318. These current sources and switches may be implemented by any topology known by those skilled in the art. These current sources and switches may provide designed current values to the circuitry within the dual-path loop filter 230. An analog voltage value on line 316 may have high frequency components removed by the loop filter 230. The loop filter 230 may provide both a Vcontrol signal on line 316 and a Vslow signal on line 348 to the oscillator 240. Oscillator 240 may be a voltage-controlled oscillator (VCO) that provides a variable frequency. The Vcontrol signal on line 316 may be coupled to a low gain input of the oscillator 240 and the Vslow signal on line 348 may be coupled to a high gain input of the oscillator 240. In one embodiment, the gains may be 1× and 3×, respectively. The gains may be in reference to changes in output frequency versus changes to input voltage. A fast control path may generate the Vcontrol signal on line 316 and a slow control path may generate the Vslow signal on line 348.

The filter 320 may include a second-order low-pass filter. A higher order loop filter may be used for better noise reduction. A second-order loop filter may suppress a voltage ripple and support an appropriate phase margin. In one embodiment, the filter 320 is a passive second-order (2-pole, 1-zero) lead-lag filter as shown. The filter 320 comprises a passive circuit including a resistance Rzero 322 in series with a first capacitance C1 324. The series combination is connected in parallel with a second capacitance C2 326. The capacitance C1 324 is an integrating capacitance that provides a first pole for the filter 320. The series combination of the Rzero 322 and the integrating capacitance, C1 324, provides a zero for the filter 320. The second capacitance C2 326 provides a second pole for the filter 320. In one embodiment, the integrating capacitance C1 324 is significantly larger, such as at least ten times larger, than the size of the second capacitance C2 326. The resistance Rzero 322 may be a programmable resistance that may change value based on given conditions. For example, one condition may be when the PLL 110 is performing a lock-in process. During this time, the resistance Rzero 322 may increase and later return to its original value when the lock-in process ends. High-frequency components may be removed from both Vcontrol signal on line 316 and Vmid voltage signal on line 330 by filter 320. The signal Vmid on line 330 may be conveyed to filter 340.

In one embodiment, the filter 340 comprises impedance Zslow 344 connected to a capacitance Cslow 346 in a first-order lag low-pass configuration as shown. The input to the impedance Zslow 344 is the voltage signal Vmid on line 330. The intersection of the impedance Zslow 344 and the capacitance Cslow 346 provides the output voltage signal Vslow of the filter 340 on line 348. A switch 342 may be connected around the impedance Zslow 344 that allows the signal Vmid on line 330 to be shorted to the signal Vslow on line 348 and the impedance Zslow 344 is bypassed. The bypass of the impedance Zslow 344 may be based on given conditions. For example, one condition may be when the PLL 110 is performing a lock-in process. During this lock-in process, the impedance Zslow 344 may be bypassed. Later, when the lock-in process ends and the PLL 110 is in a lock state, the switch 342 may open and the impedance Zslow 344 may no longer be bypassed. Similar to switches 314 and 318, switch 342 may be a semiconductor switch, such as a transistor, or may be implemented by any topology known by those skilled in the art.

In one embodiment, the impedance Zslow 344 may be a passive impedance, such as a resistance Rslow 360. In another embodiment, the impedance Zslow 344 may be an active impedance, such as a unity gain buffer 370. In one embodiment, the unity gain buffer 370 includes one active device and the output follows the input. In one embodiment, each of the capacitances 324, 326 and 346 are implemented using p-MOS transistors, wherein the source, drain, and bulk terminals are connected to a separate supply. In another embodiment, each of the capacitances 324, 326 and 346 are implemented using accumulation-mode N-MOS transistors. Although complementary metal oxide semiconductor (CMOS) processing technology may be used to fabricate the circuitry shown, other suitable technologies, such as bipolar, bi-CMOS, and silicon-on-insulator (SOI), may also be used.

Figure 4:
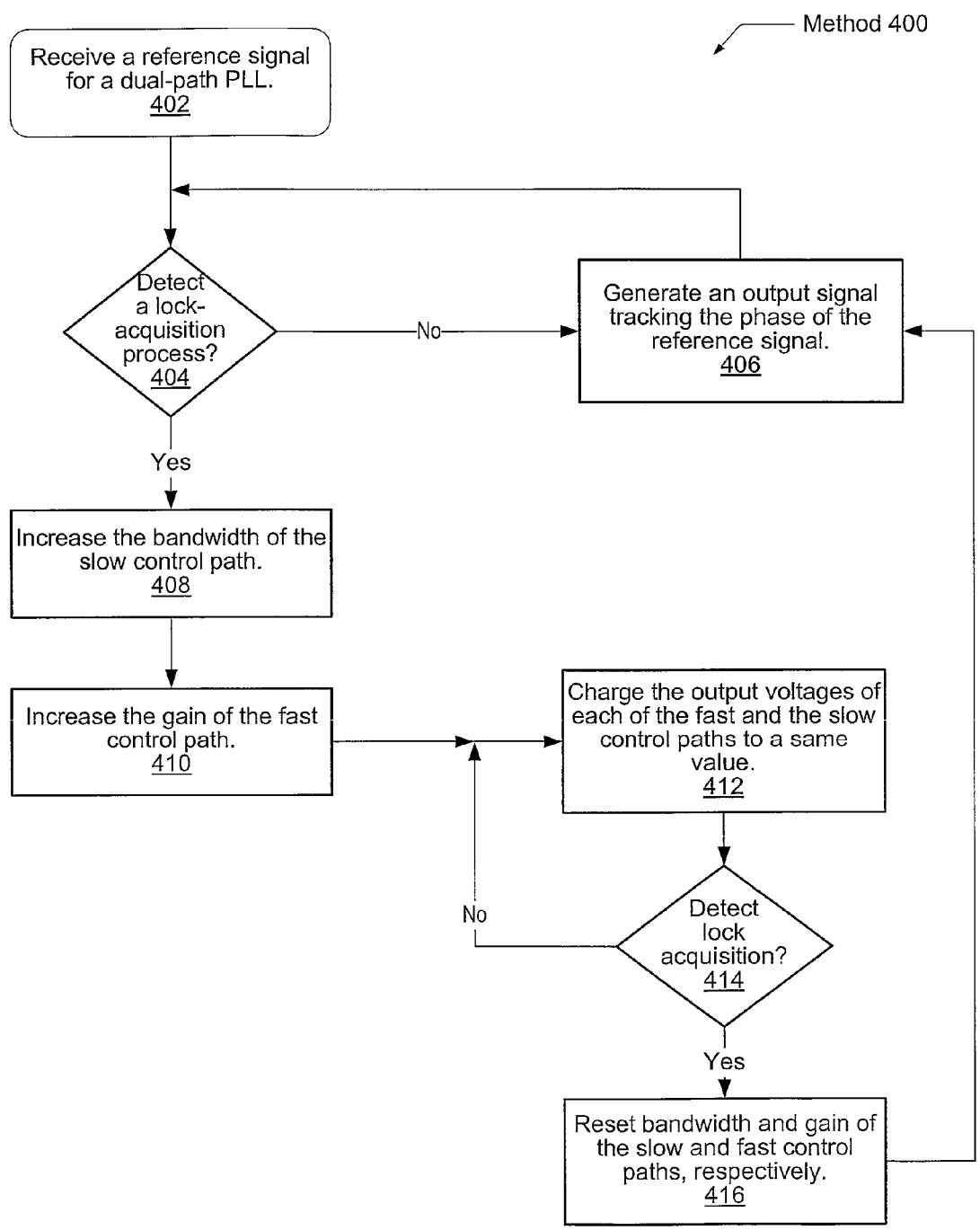
FIG. 4 is a flow diagram of one embodiment of a method for reducing lock time of a dual-path PLL.

Referring now to FIG. 4, one embodiment of a method 400 for reducing lock time of a dual-path PLL is shown. The components embodied in the PLL 110 and the dual-path loop filter 230 described above may generally operate in accordance with method 400. For purposes of discussion, the steps in this embodiment are shown in sequential order. However, some steps may occur in a different order than shown, some steps may be performed concurrently, some steps may be combined with other steps, and some steps may be absent in another embodiment.

In block 402, a dual-path PLL may receive a reference signal with a reference frequency. The phase detector 210 may compare the received reference signal to the output signal 252 or to a signal derived from the output signal 252 as described earlier. If the measured phase difference and/or frequency difference between the two signals compared by the phase detector 210 is below a given threshold (conditional block 404), then the PLL 110 may not be performing a lock acquisition process, and in block 406, the PLL 110 may generate an output signal tracking the phase of the reference signal. If the measured phase difference and/or frequency difference is above a given threshold (conditional block 404), then in block 408, the loop bandwidth of the slow control path may be increased. In one embodiment, the switch 342 may close causing a bypass of the impedance Zslow 344. The lines 330 and 348 may be shorted together and the voltage Vslow may charge up to the value at Vmid.

While the loop bandwidth is increasing in order to reduce the lock time of the PLL 110, the stability may also reduce. Therefore, in block 410, the gain of the fast control path may be increased. In one embodiment, the programmable resistance Rzero 322 may be increased. The PLL 110 is in a lock-acquisition state attempting to match the output frequency of the output signal 252 with the reference frequency of the received reference signal.

In block 412, the voltage value Vcontrol on line 316 and the voltage value Vslow on line 348 are charged to a same value. When a lock acquisition is detected (conditional block 414), then in block 416, the PLL 110 may be in a lock state and the switch 342 may be opened. In one embodiment, the lock acquisition may be detected when the two voltages, Vcontrol on line 316 and Vslow on line 348, are the same or within a given tolerance. In another embodiment, the lock acquisition may be detected when a measured phase error is less than a given threshold. Additionally, when the lock acquisition is detected, the programmable resistance Rzero 322 may be returned to its original value. Further, parasitic inductance and capacitance of signal lines within the PLL 110 may cause the voltages Vcontrol on line 316, Vslow on line 348 and other voltage signals to "ring" when these lines switch from a logic low voltage to a logic high voltage. The voltages and/or currents of these signals may oscillate undesirably before the PLL 110 settles. Circuitry may be provided to cause the PLL 110 to fully settle prior to opening switch 342. Afterward, control flow of method 400 may return to block 406.

Figure 5:
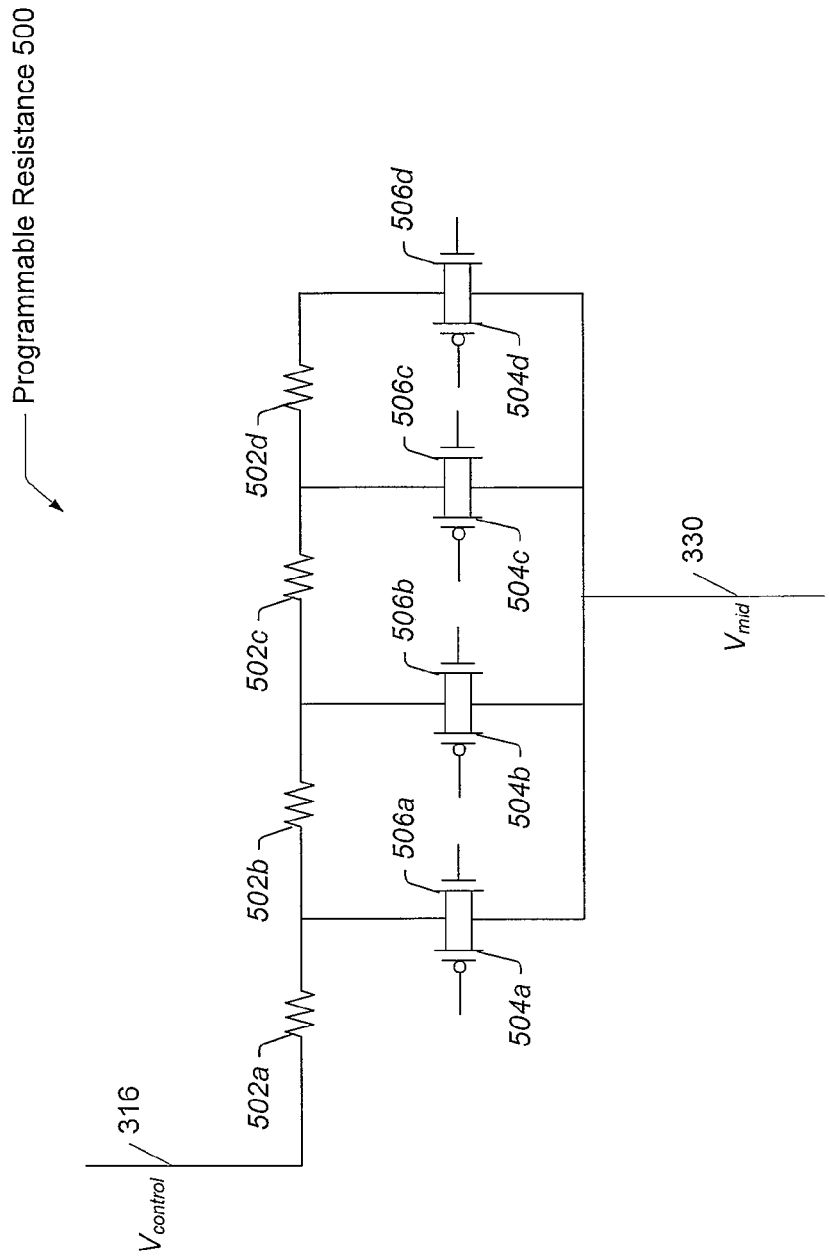
FIG. 5 is a generalized block diagram of one embodiment of a programmable resistance.

Turning now to FIG. 5, one embodiment of a generalized circuit diagram of a programmable resistance 500 is shown. As shown, multiple resistor values 502a-502d are connected in a series combination. The input to the programmable resistance may be Vcontrol on line 316 and the output may be Vmid on line 330. Multiple switches may be coupled to the line 330 and the resistors 502a-502d. These switches may be implemented with MOS transistors 504a-504d and transistors 506a-506d. The gate terminals of these transistors may receive digital values from a state machine. For example, when the PLL 110 is in a lock-acquisition state, more switches may be turned on in order to increase the total resistance between lines 316 and 330. When the PLL 110 returns to a lock state, one or more of the switches may be turned off so that the total resistance returns to an original value. In one embodiment, the programmable resistance may be used as Rzero 322 described earlier.

It is noted that the above-described embodiments may comprise software. In such an embodiment, the program instructions that implement the methods and/or mechanisms may be conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LP-DDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Additionally, program instructions may comprise behavioral-level description or register-transfer level (RTL) descriptions of the hardware functionality in a high level programming language such as C, or a design language (HDL) such as Verilog, VHDL, or database format such as GDS II stream format (GDSII). In some cases the description may be read by a synthesis tool which may synthesize the description to produce a netlist comprising a list of gates from a synthesis library. The netlist comprises a set of gates which also represent the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. Alternatively, the instructions on the computer accessible storage medium may be the netlist (with or without the synthesis library) or the data set, as desired. Additionally, the instructions may be utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A dual-path phase lock loop (PLL) circuit comprising:
an oscillator configured to adjust a frequency of an output signal based at least in part on a voltage difference between a first signal and a second signal;
a phase detector configured to generate a first control signal and a second control signal based at least in part on a phase difference between a reference signal and the output signal; and
a low-pass filter (LPF) coupled to the phase detector, wherein the LPF comprises:
a first stage configured to convey the first signal and convey an intermediate signal; and
a second stage coupled to receive the intermediate signal;
wherein in response to detecting the PLL is in a locked state, the second stage is configured to convey the second signal based at least in part on the intermediate signal and an intervening impedance element; and
wherein in response to detecting the PLL is not in a locked state, the second stage is configured to convey the second signal based at least in part on the intermediate signal while bypassing the intervening impedance element.

2. The dual-path PLL as recited in claim 1, wherein in response to detecting the PLL is not in a locked state, the LPF is further configured to increase a first resistance within the first stage.

3. The dual-path PLL as recited in claim 2, wherein in response to detecting the PLL is not in a locked state, the LPF is further configured to charge a load capacitance within the second stage to a value equal to a voltage of the second signal, wherein the load capacitance and the impedance element are connected in series when the impedance element is not bypassed.

4. The dual-path PLL as recited in claim 3, wherein, in response to detecting
the PLL has achieved a locked state, the LPF is further configured to:
remove bypass of the impedance element within the second stage while generating the second signal; and
return the first resistance within the first stage to a value the first resistance had prior to said increase.

5. The dual-path PLL as recited in claim 4, wherein the impedance element comprises a passive second resistance and the load capacitance and the passive second resistance generate a pole within the second stage.

6. The dual-path PLL as recited in claim 4, wherein the impedance element comprises an active amplifier.

7. The dual-path PLL as recited in claim 1, wherein the first stage comprises a second-order lead-lag filter and the second stage comprises a first-order lag filter coupled to an integrating capacitance within the first stage.

8. The dual-path PLL as recited in claim 4, wherein detecting the PLL is in a lock acquisition state in response to detecting at least one of the following: a power up/down state of a device associated with the PLL, a startup of a device associated with the PLL, and a frequency switch for a data transmission over a radio communication channel.

9. A method comprising:
adjusting a frequency of an output signal based at least in part on a voltage difference between a first signal and a second signal;
generating a first control signal and a second control signal based at least in part on a phase difference between a reference signal and the output signal;
conveying the first signal and an intermediate signal from a first stage of a low-pass filter (LPF) within a dual-path phase lock loop (PLL);
receiving the intermediate signal at a second stage of the LPF;
conveying the second signal from the second stage based at least in part on the intermediate signal and an intervening impedance element, in response to detecting the dual-path PLL is in a locked state; and
conveying the second signal from the second stage based at least in part on the intermediate signal while bypassing the intervening impedance element, in response to detecting the PLL is not in a locked state.

10. The method as recited in claim 9, further comprising, in response to detecting the PLL is not in a locked state, increasing a first resistance within the first stage.

11. The method as recited in claim 10, further comprising, in response to detecting the PLL is not in a locked state, charging a load capacitance within the second stage to a value equal to a voltage of the second signal, wherein the load capacitance and the impedance element are connected in series when the impedance element is not bypassed.

12. The method as recited in claim 11, in response to detecting the PLL has achieved a locked state, further comprising:
removing bypass of the impedance element within the second stage while generating the second signal; and
returning the first resistance within the first stage to a value the first resistance had prior to said increase.

13. The method as recited in claim 12, wherein the impedance element comprises a passive second resistance and the load capacitance and the passive second resistance generate a pole within the second stage.

14. The method as recited in claim 12, wherein the impedance element comprises an active amplifier.

15. The method as recited in claim 9, wherein the first stage comprises a second-order lead-lag filter and the second stage comprises a first-order lag filter coupled to an integrating capacitance within the first stage.

16. The method as recited in claim 12, wherein the state of the dual-path PLL is a lock-acquisition state in response to identification of at least one of the following: a power up/down state of a microprocessor, a startup of a microprocessor, a frequency switch for a data transmission over a radio communication channel.

17. A non-transitory computer readable medium comprising instructions which are operated upon by a program executable on a computer system, the program operating on the instructions to perform a portion of a process to fabricate an integrated circuit including circuitry described by the instructions, the circuitry being configured to:
adjust a frequency of an output signal based at least in part on a voltage difference between a first signal and a second signal;
generate a first control signal and a second control signal based at least in part on a phase difference between a reference signal and the output signal;
convey the first signal and an intermediate signal from a first stage of a low-pass filter (LPF) within a dual-path phase lock loop (PLL);
receive the intermediate signal at a second stage of the LPF;
convey the second signal from the second stage based at least in part on the intermediate signal and an intervening impedance element, in response to detecting the dual-path PLL is in a locked state; and
convey the second signal from the second stage based at least in part on the intermediate signal while bypassing the intervening impedance element, in response to detecting the PLL is not in a locked state.

18. The non-transitory storage medium as recited in claim 17, wherein, in response to detecting the PLL is not in a locked state, the circuitry being further configured to increase a first resistance within the first stage.

19. The non-transitory storage medium as recited in claim 18, wherein, in response to detecting the PLL is not in a locked state, the circuitry being further configured to charge a load capacitance within the second stage to a value equal to a voltage of the second signal, wherein the load capacitance and the impedance element are connected in series when the impedance element is not bypassed.

20. The non-transitory storage medium as recited in claim 19, wherein, in response to detecting the PLL has achieved a locked state, the circuitry being further configured to:
remove bypass of the impedance element within the second stage while generating the second signal; and
return the first resistance within the first stage to a value the first resistance had prior to said increase.

* * * * *